United States Patent
Marsh

(10) Patent No.: US 6,858,535 B2
(45) Date of Patent: Feb. 22, 2005

(54) METHODS FOR PATTERNING METAL LAYERS FOR USE WITH FORMING SEMICONDUCTOR DEVICES

(75) Inventor: Eugene P. Marsh, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 63 days.

(21) Appl. No.: 09/812,157

(22) Filed: Mar. 19, 2001

(65) Prior Publication Data

US 2001/0019885 A1 Sep. 6, 2001

Related U.S. Application Data

(63) Continuation of application No. 09/146,408, filed on Sep. 3, 1998, now Pat. No. 6,218,297.

(51) Int. Cl.[7] .............................................. H01L 91/44
(52) U.S. Cl. ........................ 438/667; 438/759; 438/396
(58) Field of Search ................................ 438/674, 396, 438/669, 754, 502, 405, 694, 695, 699, 703, 720, 603, 607, 643, 644, 648, 650, 654, 656, 666, 663, 670, 671, 685, 686, 164, 166, 171, 190, 210, 239, 240, 241, 244, 256, 329, 387, 399, 577, 578, 580, 800, 938, 782

(56) References Cited

U.S. PATENT DOCUMENTS

| | | | | |
|---|---|---|---|---|
| 4,804,438 A | | 2/1989 | Rhodes ........................ 438/660 |
| 5,191,510 A | * | 3/1993 | Huffman ...................... 361/313 |
| 5,372,849 A | | 12/1994 | McCormick et al. ........ 427/253 |
| 5,392,189 A | | 2/1995 | Fazan et al. ................. 361/305 |
| 5,489,548 A | * | 2/1996 | Nishioka et al. ............ 438/396 |
| 5,665,628 A | | 9/1997 | Summerfelt .................... 438/3 |
| 5,981,390 A | | 11/1999 | Lee et al. .................... 438/686 |
| 6,030,847 A | | 2/2000 | Fazan et al. ................... 438/3 |
| 6,054,331 A | | 4/2000 | Woo et al. ...................... 438/3 |
| 6,117,689 A | * | 9/2000 | Summerfelt .................... 438/3 |
| 6,127,277 A | * | 10/2000 | DeOrnellas et al. ........ 438/714 |
| 6,218,297 B1 | | 4/2001 | Marsh ......................... 438/654 |

OTHER PUBLICATIONS

Ghandi, S.K., VLSI Fabrication Principles, 1983, John Wiley & Sons, Inc., pp. 517–520.*

Gniewek et al., "Enhancement of Pt Adhesion Using a Si Underlay," *IBM Technical Disclosure Bulletin*, 20(3), 1009 (1977).

Hofer et al., "Double Layer Lift–Off Process for Packaging," *IBM Technical Disclosure Bulletin*, 26(7B), 3771 (1983).

* cited by examiner

Primary Examiner—George Fourson
Assistant Examiner—Julio J. Maldonado
(74) Attorney, Agent, or Firm—Mueting, Raasch & Gebhardt, P.A.

(57) ABSTRACT

The present invention provides a method for forming a discontinuous conductive layer in the fabrication of integrated circuits. The method includes providing a substrate assembly having a surface including at least one metal-containing adhesion region separated by at least one surface region of the substrate assembly. A conductive metal layer is formed on the surface of the substrate assembly. The substrate assembly including the conductive metal layer thereon is then annealed. Any nonadhered conductive metal is removed from the at least one exposed surface region to form a discontinuous conductive metal layer on at least one metal-containing adhesion region, for example, by simply rinsing the substrate assembly in water. The conductive metal layer can be platinum or ruthenium.

52 Claims, 7 Drawing Sheets

METHODS FOR PATTERNING METAL LAYERS FOR USE WITH FORMING SEMICONDUCTOR DEVICES

This is a continuation of application Ser. No. 09/146,408, filed Sep. 3, 1998, now U.S. Pat. No. 6,218,297, which is incorporated herein by reference.

FIELD OF THE INVENTION

The present invention relates to semiconductor devices and the fabrication thereof. More particularly, the present invention pertains to a method of patterning platinum and semiconductor devices including the same.

BACKGROUND OF THE INVENTION

In the fabrication of integrated circuits, various conductive layers are used. For example, during the formation of semiconductor devices, such as dynamic random access memories (DRAMs), static random access memories (SRAMs), ferroelectric (FE) memories, etc., conductive materials are used in the formation of storage cell capacitors and also may be used in interconnection structures, e.g., conductive layers of contact holes, vias, etc.

As memory devices become more dense, it is necessary to decrease the size of circuit components forming such devices. One way to retain storage capacity of storage cell capacitors of the memory devices and at the same time decrease the memory device size is to increase the dielectric constant of the dielectric layer of the storage cell capacitor. Therefore, high dielectric constant materials are used in such applications interposed between two electrodes. One or more layers of various conductive materials may be used as the electrode material.

Generally, various metals and metallic compounds, for example, metals such as ruthenium and platinum, have been proposed as the electrodes for at least one of the layers of an electrode stack for use with high dielectric constant materials. Many storage cell capacitors are fabricated which include electrode layers that are formed of a conductive material within a small high aspect ratio opening. One particularly preferred material for forming an electrode in a high dielectric capacitor is platinum. However, one of the problems typically associated with the use of platinum is the lack of a practical etch process. Thus, conventional techniques used to form a platinum electrode include CMP (chemical-mechanical polishing) or ion milling. However, these techniques pose particular problems when utilized for forming patterned platinum features. For example, CMP is typically used to achieve a planar surface over the entire wafer and/or chip. However, it may be difficult to polish a layer formed within a small high aspect ratio opening using CMP. Ion milling typically includes the use of a broad ion beam to impinge on the wafer surface in a defined direction with respect to the feature to be etched. However, due to the physical characteristics of platinum, ion milling is generally difficult to perform, for example, it is typically a relatively slow and non-selective process which may result in an over etching of underlying layers.

SUMMARY OF THE INVENTION

There is a need in the art to reliably and accurately pattern platinum, particularly when forming electrodes, e.g., as a lower or bottom electrode, in high dielectric capacitors. To overcome the problems described above, and others that will be readily apparent from the description below, a conductive layer is patterned utilizing an adhesion layer in accordance with the present invention. The patterned layer can be used in interconnection structures, e.g., contacts, vias, etc. Patterning the layer in accordance with the present invention likely results in a reduction of processing costs by eliminating some of the etching and/or CMP processing steps typically associated with formation of structures. A patterned layer formed in accordance with the present invention is preferably a conductive metal selected from the group consisting of platinum or ruthenium.

One aspect of the present invention provides a method for patterning a platinum layer in the fabrication of integrated circuits. The method includes providing a substrate assembly including a surface in a reaction chamber; forming a patterned metal-containing adhesion layer on the surface, resulting in at least one exposed surface region of the substrate assembly; forming platinum on the patterned metal-containing adhesion layer and the at least one exposed surface region of the substrate assembly; annealing the substrate assembly including the patterned metal-containing adhesion layer and the platinum thereon; and removing platinum from the at least one exposed surface region of the substrate assembly.

Another aspect of the present invention provides a method for forming a discontinuous conductive layer in the fabrication of integrated circuits. The method includes providing a substrate assembly in a reaction chamber, the substrate assembly having a surface including at least one metal-containing adhesion region separated by at least one surface region of the substrate assembly; forming a platinum layer on the surface of the substrate assembly; annealing the substrate assembly including the platinum layer thereon; and removing platinum from the at least one exposed surface region to form a discontinuous platinum layer on at least one metal-containing adhesion region.

Yet a further aspect of the present invention provides a method for forming a platinum layer in the fabrication of integrated circuits. The method includes providing a substrate assembly in a reaction chamber, the substrate assembly including a surface having a patterned metal-containing adhesion portion thereon; depositing a platinum layer on the surface of the substrate assembly and the patterned metal-containing adhesion portion thereon, wherein the platinum layer has a thickness of about 600 Å or less; annealing the substrate assembly at a temperature of about 1100° C. or less; and removing unadhered platinum from the surface of the substrate assembly such that a resulting patterned platinum layer has a configuration substantially that of the patterned adhesion portion.

Yet another aspect of the present invention provides a method for use in forming a capacitor. The method includes providing a substrate assembly, the substrate assembly including at least one surface; and forming an electrode on the at least one surface of the substrate assembly, wherein forming the electrode comprises at least forming a platinum electrode layer, wherein forming the platinum electrode layer includes: forming a metal-containing adhesion layer on the at least one surface, and forming the platinum layer only on the metal-containing adhesion layer. Preferably, forming the platinum electrode layer includes forming a layer of platinum on the at least one surface of the substrate assembly and the metal-containing adhesion layer; annealing the substrate assembly; and removing platinum on the at least one surface of the substrate assembly such that the platinum layer is formed only on the metal-containing adhesion layer.

Typically, the substrate assembly includes an opening defined therein, wherein the opening is defined by a bottom surface of the substrate assembly and at least one side wall extending therefrom and further wherein the metal-containing adhesion layer is formed on the surfaces defining the opening.

A further aspect of the present invention provides a method for forming a discontinuous conductive layer in the fabrication of integrated circuits. The method includes providing a substrate assembly in a reaction chamber, the substrate assembly having a surface including at least one metal-containing adhesion region separated by at least one surface region of the substrate assembly; forming a conductive metal layer on the surface of the substrate assembly, wherein the conductive metal layer comprises a metal different from a metal in the least one metal-containing adhesion region; annealing the substrate assembly including the conductive metal layer thereon; and removing conductive material metal from the at least one exposed surface region to form a discontinuous conductive metal layer on at least one metal-containing adhesion region. Preferably, the conductive metal layer comprises a metal selected from the group consisting of platinum or ruthenium.

Preferably, a conductive metal layer, e.g., platinum or ruthenium, has thickness of about 600 Å or less, and more preferably a thickness of about 500 Å or less.

In accordance with the present invention, annealing is typically accomplished at a temperature less than the melting point of the at least one exposed surface region, and more preferably the substrate assembly is exposed to a temperature less than the melting point of the at least one surface region for a time period sufficient to cause pooling of the platinum on the insulating portion of the at least one surface region. Typically, the temperature is between about 650° C. and about 1100° C. Typically, the period of time is between about 5 seconds and about 5 minutes.

Preferably, annealing occurs in an atmosphere comprising a compound selected from the group consisting of oxygen, ozone, nitrogen, argon, $NO_x$, $SO_3$, $N_2O$, and a combination thereof. More preferably, annealing the substrate assembly is selected from the group consisting of an RTO anneal or an RTN anneal.

The patterned metal-containing adhesion layer preferably includes a material selected from the group consisting of titanium, tantalum, tungsten, rhodium, iridium, cobalt, and nitrides, oxides, and silicides thereof. In one embodiment, the patterned metal-containing adhesion layer includes titanium nitride.

As used herein, "discontinuous" refers to areas or regions of a first material (e.g., a metal-containing adhesion layer and/or a platinum layer) that are separated by areas of a second material (e.g., silicon, BPSG, etc.), i.e., the areas of the second material are substantially free of the first material. The areas of the first material may be in a regular pattern or may be in a random pattern. Preferably, the second area, i.e., a surface of a substrate assembly, includes a material selected from the group consisting of silicon, silicon dioxide, BPSG, PSG, $Al_2O_3$, and a combination thereof.

As used herein "pools" or "pooling" refers to a phenomenon that is believed to be similar to non-wetting of a surface wherein the binding energy of the material deposited (e.g., platinum, ruthenium) is much greater to itself that to the surface to which it is deposited (e.g., silicon, BPSG, etc.) so that "islands" of the deposited material form.

In accordance with the present invention, the pools of material can be removed by rinsing the substrate assembly in a rinsing composition for a period of time of about 5 minutes or less. Preferably, the rinsing composition is selected from the group consisting of water, aqua regia, hydrofluoric acid, hydrochloric acid, hydrogen peroxide, and a combination thereof.

BRIEF DESCRIPTION OF THE DRAWINGS

The present invention will be better understood from reading the following description of illustrative embodiments with reference to the attached drawings, wherein below.

DETAILED DESCRIPTION OF THE EMBODIMENTS

Figure 1A:
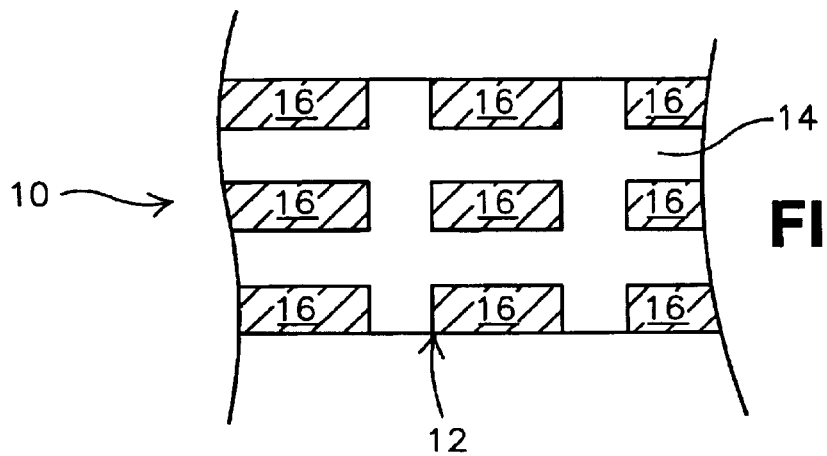
FIGS. 1A–1C illustrate a multiple step method of patterning platinum according to the present invention.
Figure 1B:
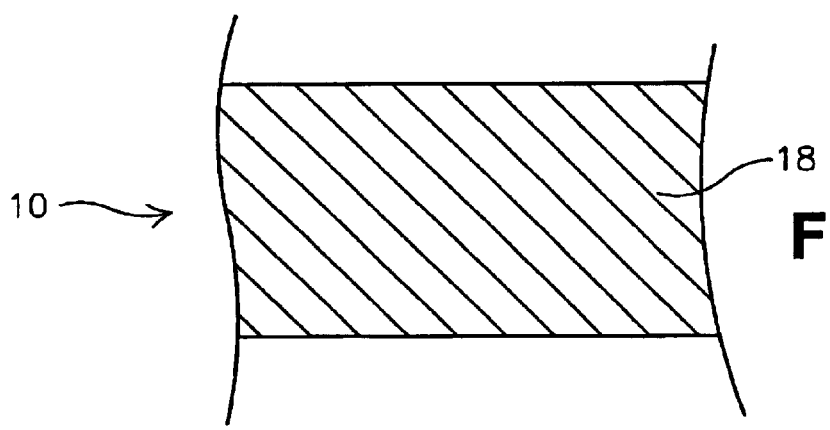
Figure 1C:
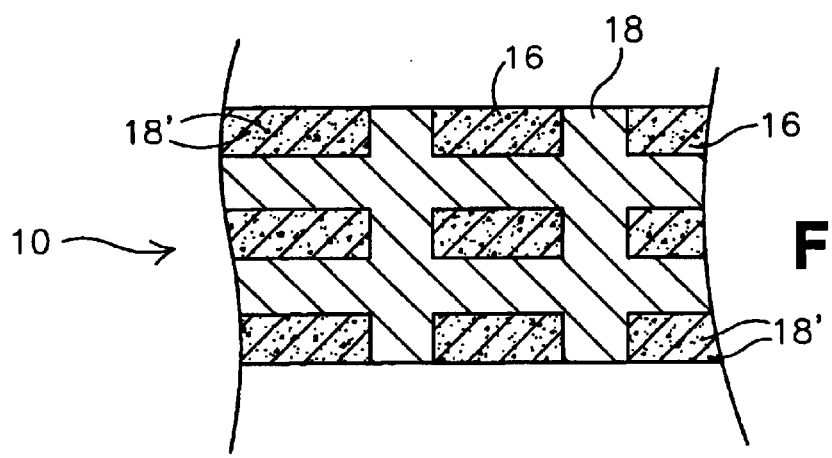

An illustration of a method of the present invention shall be described generally with reference to FIGS. 1A–1C. Thereafter, a capacitor structure in accordance with the present invention is given with reference to FIG. 2. Further, examples of patterning platinum in accordance with the present invention will be made with reference to FIGS. 3A–3E.

FIG. 1A shows a structure 10 including a substrate assembly 12 which includes a patterned adhesion layer 14, preferably a metal-containing adhesion layer, is formed on the surface of a layer 16 on the substrate assembly 12. The substrate assembly 12 may include silicon dioxide, BPSG, PSG, etc. Further, the layer 16 may be a silicon substrate, GaAs, $Al_2O_3$, or any other layer on which one skilled in the art would form a patterned platinum layer. The present invention is directed to methods of forming a patterned conductive layer, preferably platinum, by providing the patterned adhesion layer, depositing a platinum layer, annealing, and removing non-adhered platinum.

Patterned conductive layers formed according to the present invention are particularly useful in forming lower electrodes of capacitor structures for a memory device, e.g., a DRAM, an SRAM, an FE memory, etc. However, it should be understood that the methods of providing patterned conductive layers, including a patterned platinum layer, can be used in any application or structure in which a patterned conductive layer would be useful.

As used in this application, substrate assembly refers to either a semiconductor substrate such as the base semiconductor layer, e.g., the lowest layer of a silicon material on a wafer, or a silicon layer deposited on another material, such as silicon on sapphire, or a semiconductor substrate having one or more layers or structures formed thereon or regions formed therein. When reference is made to a substrate assembly in the following description, various process steps may have been previously used to form or define regions, junctions, various structures or features, and openings such as vias, contact openings, high aspect ratio openings, etc. For example, as used herein, substrate assembly may refer to a structure upon which a lower electrode of a capacitor structure is formed.

It will be understood that the methods of the present invention are typically performed in chemical vapor deposition (CVD) chambers of the type used to process semiconductor wafers, although any equipment and method for depositing layers according to the present invention may be used. For example, the CVD processes described herein may be carried out in a chemical vapor deposition reactor, such as a reaction chamber available under the trade designation of 7000 from Genus, Inc. (Sunnyvale, Calif.), a reaction chamber available under the trade designation of 5000 from Applied Materials, Inc. (Santa Clara, Calif.), or a reaction chamber available under the trade designation of Prism from Novelus, Inc. (San Jose, Calif.). However, any reaction chamber suitable for performing CVD may be used.

Chemical vapor deposition is defined as the formation of a nonvolatile solid film on a substrate by reaction of vapor phase reactants, i.e., reacting gases, that contain desired components. The reacting gases are introduced into the reaction chamber. The gas is decomposed and reacted at a heated wafer surface to form the desired layer. Chemical vapor deposition is just one process of providing thin layers on semiconductor wafers, such as films of elemental metals or compounds, e.g., platinum, titanium, tantalum, tungsten, rhodium, iridium, including nitrides and silicides thereof. Chemical vapor deposition processes are capable of providing highly conformal layers even within deep contacts, container openings, and other openings. Thus, as described further below with reference to the figures, CVD processing is preferably used to provide highly conformal layers within openings such as for lower electrodes of storage cell capacitors, e.g., container capacitors or trench capacitors. It will be readily apparent to one skilled in the art that although CVD is the preferred process, the CVD process may be enhanced by various related techniques such as plasma assistance, photo assistance, laser assistance, as well as other techniques.

As used herein, the term "deposition temperature" will typically refer to the surface temperature of the substrate assembly or layer on which a material is being deposited; the term "flow rate" as used in connection with gas flow rates will typically refer to the gas flow rate into the CVD reaction chamber; and the term "deposition pressure" will typically refer to the pressure in the CVD chamber.

Further, it will be understood that as used in connection with the present invention, the term "annealing" may be performed in the CVD chamber and includes exposing a structure being formed to any combination of temperature and pressure for predetermined time periods which will enhance the formation of a discontinuous metal layer in accordance with the present invention such that any non-adhered metal material may be easily removed to attain a discontinuous metal layer. Such annealing may be performed in an inert gas atmosphere and with or without plasma enhancement.

The patterned adhesion layer 14, as shown in FIG. 1A, can be formed over the substrate assembly 12 by depositing a metal containing layer by CVD. As mentioned above, the patterned adhesion layer 14 is preferably metal-containing. Typically, a CVD process is conducted with a metal containing precursor being delivered to a reaction chamber. Diluent gases may also optionally be provided to the reaction chamber.

The metal containing precursor may be a liquid or a solid at room temperature. Typically, however, such precursors are liquids. If they are solids, they are preferably sufficiently soluble in an organic solvent or have melting points below their decomposition temperature such that they can be used in flash vaporization, bubbling, microdroplet formation techniques, etc. However, they may also be sufficiently volatile that they can be vaporized or sublimed from the solid state using known chemical vapor deposition techniques. Thus, the precursor composition of the present invention can be in solid or liquid form. As used herein, "liquid" refers to a solution or a neat liquid (a liquid at room temperature or a solid at room temperature that melts at an elevated temperature). As used herein, a "solution" does not require complete solubility of the solid; rather, the solution may have some undissolved material. Preferably, however, there is a sufficient amount of the material that can be carried by the organic solvent into the vapor phase for chemical vapor deposition processing.

If the metal precursor is a liquid, it may be delivered through use of bubbling techniques. Generally, the liquid precursor is contained in a bubble reservoir through which a carrier gas, such as helium or any other inert gas, i.e., a gas that is nonreactive with other gases in the process (e.g., nitrogen, argon, neon, and xenon) is passed. In other words, the carrier gas is bubbled through the reservoir containing the precursor to deliver the precursor to the reaction chamber.

One skilled in the art will recognize that the manner in which the gases are introduced into the reaction chamber may include one of various techniques. For example, in addition to provision by bubbler techniques, the introduction may be accomplished with the use of compounds which are gases at room temperature or by heating a volatile compound and delivering the volatile compound to the reaction chamber using a carrier gas. Further, solid precursors and various methods of vaporizing such solid precursors may also be used for introduction of reactant compounds into the chamber. As such, the present invention is not limited to any particular technique.

Further, typically, the reacting gases are admitted at separate inlet ports. In addition to the other gases provided to the reaction chamber, an optional diluent gas, i.e., a gas that is nonreactive with the reacting gases, may also be introduced in the chamber such as to change the partial pressures of the gases therein. For example, argon or nitrogen may be introduced into the chamber at a varied flow rate. The CVD process can be performed with or without any plasma enhancement.

The metal containing layer for use in forming the patterned adhesion layer 14 may also be deposited by other conventional techniques, such as PVD or physical vapor deposition. These techniques can include sputter deposition, co-sputter deposition, evaporation deposition, and co-evaporation deposition and the like.

Preferably, the metal containing precursor is generally a liquid precursor. The metal containing precursor can be of any know in the art and typically includes a metal such as titanium, rhodium, iridium, tungsten, copper, cobalt, lanthanides, including nitrides, oxides and silicides thereof. More preferably, the metal-containing patterned adhesion layer 14 is titanium nitride. The titanium nitride layer can be formed by evaporating the titanium in a nitrogen atmosphere, by reactively sputtering titanium in an argon and nitrogen atmosphere, by sputtering from a titanium nitride target in an inert atmosphere, or by sputter depositing titanium in an argon atmosphere and converting it to titanium nitride in a separate plasma nitridation step.

Preferably, the titanium nitride layer is deposited by CVD to obtain conformal coverage. Preferably, the CVD process for forming the titanium nitride layer is accomplished under the following conditions: pressure of about 0.5 torr; a chuck temperature of about 560° C.; a flow rate of about 25 sccm of $NH_3$; a flow rate of about 25 sccm of nitrogen; and a flow rate of about 50 sccm of a carrier gas.

Once deposited, typically, the metal-containing adhesion layer is then patterned, resulting in the patterned adhesion layer 14 illustrated in FIG. 1A. This can be accomplished by using conventional patterning techniques, including lithography, etching (either chemical or mechanical) and/or chemical-mechanical polishing. The patterned adhesion layer 14 is preferably in the pattern configuration that is desired for the patterned conductive layer, e.g. platinum, configuration to be formed using the patterned adhesion layer 14.

Once the adhesion layer 14 is formed, a conductive layer 18, e.g. platinum or ruthenium, is then deposited over the entire structure 10, as shown in FIG. 1B. This is preferably accomplished by CVD utilizing a precursor containing a metal selected from the group consisting of platinum or ruthenium. A platinum containing precursor can be selected from $MeCpPt(Me)_3$ (where Cp=cyclopentadienyl), $Pt(PF_3)_4$, $Pt(CO)_2Cl_2$, $Pt(CH_3)_2[(CH_3)CN]$, $(COD)Pt(CH_3)_2$, $(COD)Pt(CH_3)Cl$, $(C_5H_5)Pt(CH_3)(CO)$, $(acac)(Pt)(CH_3)_3$, wherein COD=1,5 cycloctadiene and acac=acetylacetonate. A ruthenium containing precursor can be selected from the group of can have the formula $L_yRuX_z$, wherein L is a neutral or monoanionic ligand selected from the group consisting essentially of linear hydrocarbyls, branched hydrocarbyls, cyclic hydrocarbyls, cyclic alkenes, dienes, cyclic dienes, bicyclic dienes, trienes, cyclic trienes, bicyclic alkenes, bicyclic dienes, bicydic trienes, tricyclic alkenes, tricyclic dienes, tricycic trienes, fluorinated derivatives thereof, combinations thereof, and derivatives thereof additionally containing heteroatoms such as a halide, Si, S, Se, P, As, N or O; y has a value from one to three; X is a pi-bonding ligand selected from the group consisting essentially of CO, NO, CN, CS, nitriles, isonitriles, trialkylphosphine, trialkylamine, isocyanide, and combinations thereof; and z has a value from 1 to three, as described in U.S. Pat. No. 6,063,705, entitled "Precursor Chemistries for Chemical Vapor Deposition of Ruthenium and Ruthenium Oxide." Other suitable precursors can have the formula $(diene)Ru(CO)_3$, wherein "diene" refers to linear, branched, or cyclic dienes, bicyclic dienes, tricyclic dienes, fluorinated derivatives thereof, derivatives thereof additionally containing heteroatoms such as halide, Si, S, Se, P, As, N or O, or combinations thereof, as described in U.S. Pat. No. 6,074,945, entitled "Methods for Preparing Ruthenium Metal Films." These precursors can be prepared according to the methods described in the above-referenced patent applications or according to the methods described in U.S. Pat. No. 5,962,716, entitled "Methods for Preparing Ruthenium and Osmium Compounds." Other suitable precursors can have the formulae (1) $(CO)_4ML$ or (2) $M_2[\mu\text{-}(\eta^2:\eta^4\text{-}C_4R_4](CO)_6$, wherein M is iron, ruthenium, or osmium in formula (1) and L is a two-electron donor ligand and each R is H, halo, OH, alkyl, perfluoroalkyl, or aryl, as described in U.S. Pat. No. 5,372,849 (McCormick et al.). Prefered precursors can be selected from the group of $(cyclohexadiene)Ru(CO)_3$, $(cycloheptadiene)Ru(CO)_3$, bis(isoproplylcyclopentadienyl) ruthenium, bis(isoproplylcyclopentadienyl)osmium; osmium tetrachloride; tris(acetylacentonate)ruthenium; ruthenium carbonyl chloride; and penta(trifluorophosohine) ruthenium.

Preferably, the platinum layer 18 has a thickness preferably about 600 Å or less, more preferably about 500 Å or less, and even more preferably about 400 Å to about 200 Å. Thus, a deposition rate for forming a platinum layer while maintaining substantial coverage over the entire surface is a deposition rate in the range of about 5000 Å/minute to about 100 Å/minute. Yet further, to achieve the desired platinum layer characteristics above, preferably, a flow rate of about 10 sccm to about 5000 sccm of a carrier gas for the platinum precursor is provided to the chamber. More preferably, the flow rate of the platinum containing precursor to the reaction chamber is at a rate in the range of about 50 sccm to about 500 sccm.

Further, to achieve the desired platinum layer characteristics as described above, various other parameters of the CVD process may be varied. Preferably, the deposition pressure of the CVD process is in the range of about 0.4 torr to about 10 torr. More preferably, the pressure is in the range of about 1 torr to about 5 torr. Further, the deposition temperature of the CVD process is preferably in a range of about 100° C. to about 500° C. More preferably, the deposition temperature is in the range of about 200° C. to about 300° C.

Preferably, the CVD process is performed without plasma enhancement. Further, a diluent gas may be provided into the reaction chamber at a rate of up to about 500 sccm. Preferably, the diluent gas is one of nitrogen or argon.

After formation of the layer 18, the structure is preferably annealed to aid in patterning the layer 18, i.e., to aid in forming a discontinuous layer. Preferably, the structure is annealed at a pressure of about 0.1 millitorr to about 5 atmospheres. More preferably, the anneal is performed at a pressure of about 1 torr to about 760 torr. Further, the anneal is performed at a temperature of about 650° C. or greater, but less than the melting point of the substrate assembly material, more preferably in a range of about 650° C. to about 1100° C. Even more preferably, the anneal is performed at a temperature in the range of about 700° C. to about 800° C. The anneal is preferably performed for a time period of between 30 seconds to 5 minutes.

Further, preferably, the anneal is performed while the structure is present in a gas environment. Preferably, the gas environment is an atmosphere of oxygen, ozone, argon, nitrogen, helium, etc., and a combination thereof.

Preferably, the anneal is performed as a furnace anneal or a rapid thermal processing (RTP) anneal. Further, such anneals may be performed in one or more annealing steps within the time periods, temperature ranges, and other parameters set forth above. More preferably, the anneal is a rapid thermal oxidation (RTO) anneal or a rapid thermal nitridation (RTN) anneal, carried out in the following range of parameters: for RTO, the conditions are preferably a temperature range of 700–800° C., for a time range of about 30–60 seconds at 1 atm oxygen; and for RTN, the conditions are preferably a temperature range of 700–800° C., for a time range of about 30–60 seconds at 1 atm nitrogen.

Once annealed, the platinum layer 18 forms directly on the patterned metal-containing adhesion layer 14, as shown in FIG. 1C. The platinum previously formed on the surface of the exposed substrate assembly 12, e.g., BPSG, PSG, silicon, etc., aggregates and forms at least one platinum pool 18'. The pools 18' can be removed relatively easily by exposing the structure in a rinsing composition for a sufficient time such that the pools lift off the structure. Suitable rinsing compositions include water (typically at a temperature of about 30° C.), aqua regia (three parts hydrochloric acid to 1 part nitric acid), hydrofluoric acid, hydrochloric acid, hydrogen peroxide, and a combination thereof, for example. More preferably, removal of the pools is accomplished by rinsing the structure in the rinsing composition for a time of about 5 minutes or less, even more preferably about 1 minute or less, in a conventional ultrasonic bath.

The method of the present invention particularly useful in forming fine platinum patterns, fine lines of a certain width, etc. While not wishing to be bound by any particular theory, it is believed that for layers having a thickness greater than 600 Å, the platinum pools tend to coalesce and form a continuous film.

It has been found that the platinum a layer having a thickness of 700 Å or more does not form pools that are easily removed in accordance with the present invention. In order to adequately pool platinum on the regions of a surface that do not include the metal-containing adhesion layer, the platinum layer more preferably has a thickness of about 600 Å or less, and even more preferably about 400 Å to about 200 Å. Additionally, it is believed that adhesion to silicon and BPSG is sufficiently poor that the platinum pools simply lift off in the rinsing composition, e.g., water.

Although the foregoing has been described with particular attention to forming a discontinuous platinum layer, other discontinuous conductive layers can be formed in accordance with the present invention, such as ruthenium, as mentioned above.

Although patterning platinum described above may be used for one or more numerous applications, e.g., interconnection applications, capacitor applications, etc., the present invention is particularly useful when forming layers in small high aspect ratio openings. As described herein, small high aspect ratio openings have feature sizes or critical dimensions below about 1 micron (e.g., such as a diameter or width of an opening being less than about 1 micron), and aspect ratios greater than about 1. Such aspect ratios are applicable to contact holes, vias, trenches, and any other configured openings, such as container or trench openings for formation of capacitor structures. For example, a trench having an opening dimension of 1 micron and a depth of 3 microns has an aspect ratio of 3.

One skilled in the art will recognize that the platinum patterning method described above may be used in addition to other layers of a structure. For example, an electrode may be a multi-layer electrode formed of other metals with one of the layers, e.g., an upper layer, formed from platinum, as described herein and below with reference to FIG. 2.

Figure 2:
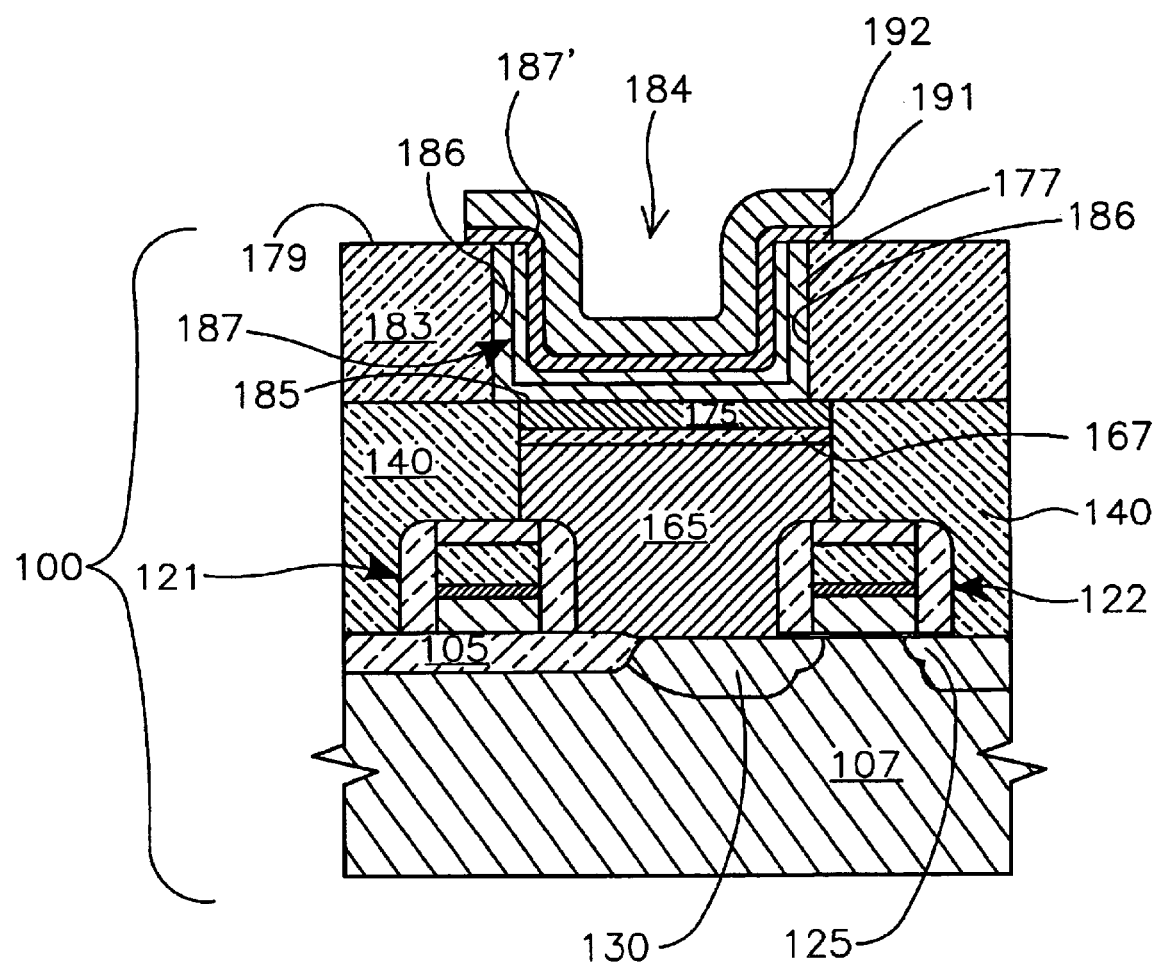
FIG. 2 is an illustrative diagram of a container capacitor structure using a lower electrode formed according to the present invention in a storage cell application.

FIG. 2 shows a conductive lower electrode 187 formed according to one of the processes described herein for a high dielectric capacitor of a storage cell. There are other semiconductor processes and structures for various devices, e.g., CMOS devices, memory devices, etc., that would benefit from the present invention and in no manner is the present invention limited to the illustrative embodiments described herein, e.g., an electrode structure.

As shown in FIG. 2, a device structure 100 is fabricated in accordance with conventional processing techniques through the formation of an opening 184. Such processing is performed prior to depositing a bottom electrode structure 187 on the surfaces defining the opening 184 using the methods in accordance with the present invention. As such, and as further described in U.S. Pat. No. 5,392,189 to Fazan et al., entitled "Capacitor Compatible with High Dielectric Constant Materials Having Two Independent Insulative Layers and the Method for Forming Same," issued Feb. 21, 1995, the device structure 100 includes field oxide regions 105 and active regions, i.e., those regions of the substrate 107 not covered by field oxide. A word line 121 and a field effect transistor (FET) 122 are formed relative to the field oxide 105. Suitable source/drain regions 125, 130 are created in silicon substrate 107. An insulative conformal layer of oxide material 140 is formed over regions of FET 122 and word line 121. A polysilicon plug 165 is formed to provide electrical communication between substrate 107 and a storage cell capacitor to be formed thereover. Various barrier layers are formed over the polysilicon plug 165, such as, for example, layers 167 and 175. For example, such layers may be titanium nitride, tungsten nitride, or any other metal nitride which acts as a barrier. Thereafter, another insulative layer 183 is formed and the opening 184 is defined therein.

According to one embodiment of the present invention, a patterned adhesion layer 177 is formed according to the present invention by forming a metal-containing layer, e.g., titanium nitride, on the structure including surface 179 of insulative layer 183, bottom surface 185 and the one or more side walls 186 defining opening 184. The metal-containing layer is then planarized or etched back resulting in the patterned adhesion layer 177 lining the opening 184. Thereafter, a platinum layer 187' is formed over the structure 100 according to the previously described methods herein. The structure, including the platinum, is annealed (e.g., an RTO or an RTN anneal) as described herein, resulting in the platinum layer 187' adhered on the patterned adhesion layer 177 and pools of non-adhered platinum on the insulative layer 183, e.g., BPSG. The pools of non-adhered platinum are then removed, as described above. A dielectric layer 191 formed of material such as $Ta_2O_5$, $Ba_xSr_{(1-x)}TiO_3$ [BST], $BaTiO_3$, $SrTiO_3$, $PbTiO_3$, $Pb(Zr,Ti)O_3$ [PZT], $(Pb,La)(Zr,Ti)O_3$ [PLZT], $(Pb,La)TiO_3$ [PLT], $KNO_3$, and $LiNbO_3$ can then be formed relative to the platinum layer 187'. Optionally, thereafter, a second electrode 192, including one or more conductive layers, e.g., titanium nitride, is formed relative to the dielectric material 191.

EXAMPLE

A patterned platinum layer was formed according to the following process. Platinum was deposited on an unprocessed p-type silicon wafer in a research scale CVD reaction chamber, commercially available from MDC Corp., Hayward, Calif. The wafer was heated to a temperature of 215° C. Helium carrier gas was supplied to the platinum bubbler at a flow rate of 30 sccm. The platinum bubbler was maintained at a temperature of 33° C. Oxygen gas was supplied to the reaction chamber at a flow rate of 50 sccm. The reaction chamber was maintained at a pressure of 5 torr. The deposition was allowed to continue for 6 minutes, resulting in a platinum layer having a thickness of 400 Å. The wafer having the platinum layer thereon was then annealed in an RTO anneal. The wafer was placed in a chamber and the ambient temperature was increased to 850° C. over a period of 100 seconds. The annealing was then allowed to continue for 30 seconds.

Figure 3A:
FIG. 3A is a scanning electron micrograph showing platinum deposited on silicon in accordance with the present invention.

FIG. 3A is a scanning electron micrograph showing platinum deposited on silicon, wherein a fine grain platinum layer having a thickness of 400 Å was formed.

Figure 3B:
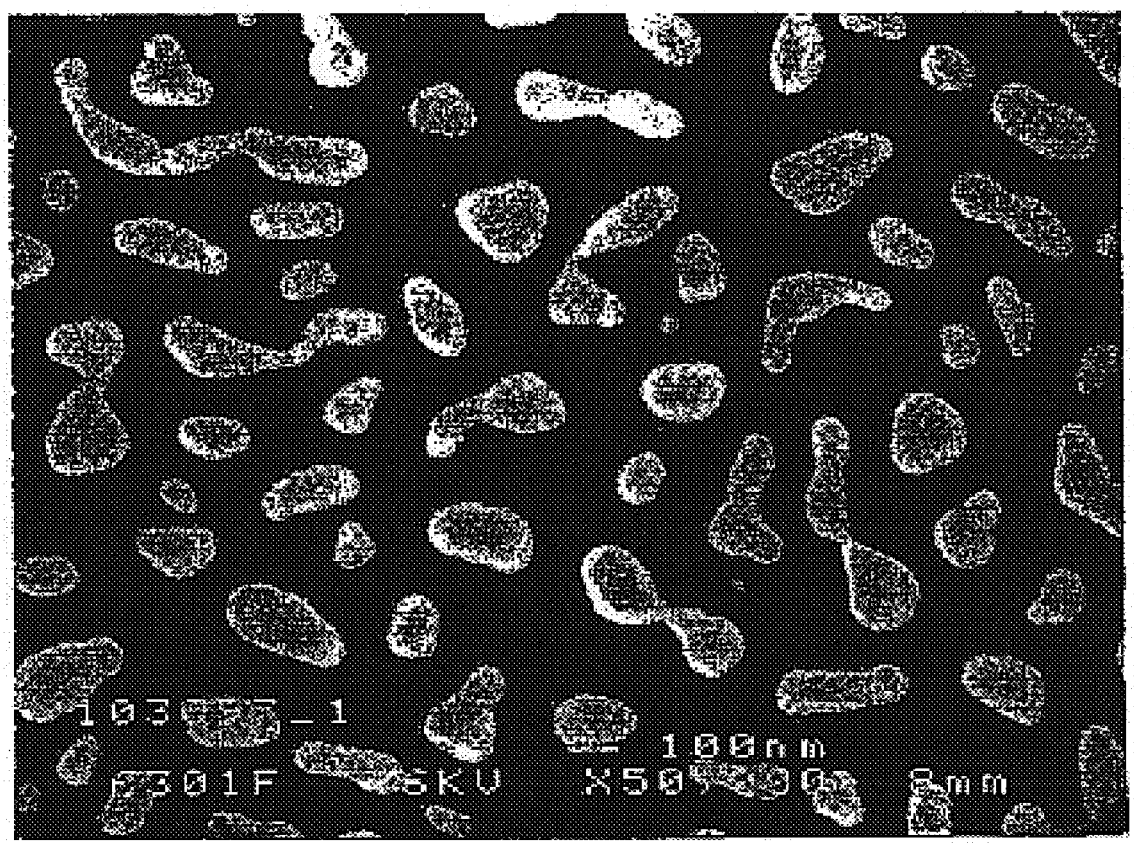
FIG. 3B is a scanning electron micrograph showing platinum deposited on silicon in FIG. 3A after annealing according to the present invention.

FIG. 3B is a scanning electron micrograph showing platinum deposited on silicon in FIG. 3A after annealing according to the present invention. The light "island" formations were found to be pooled platinum on the silicon.

Figure 3C:
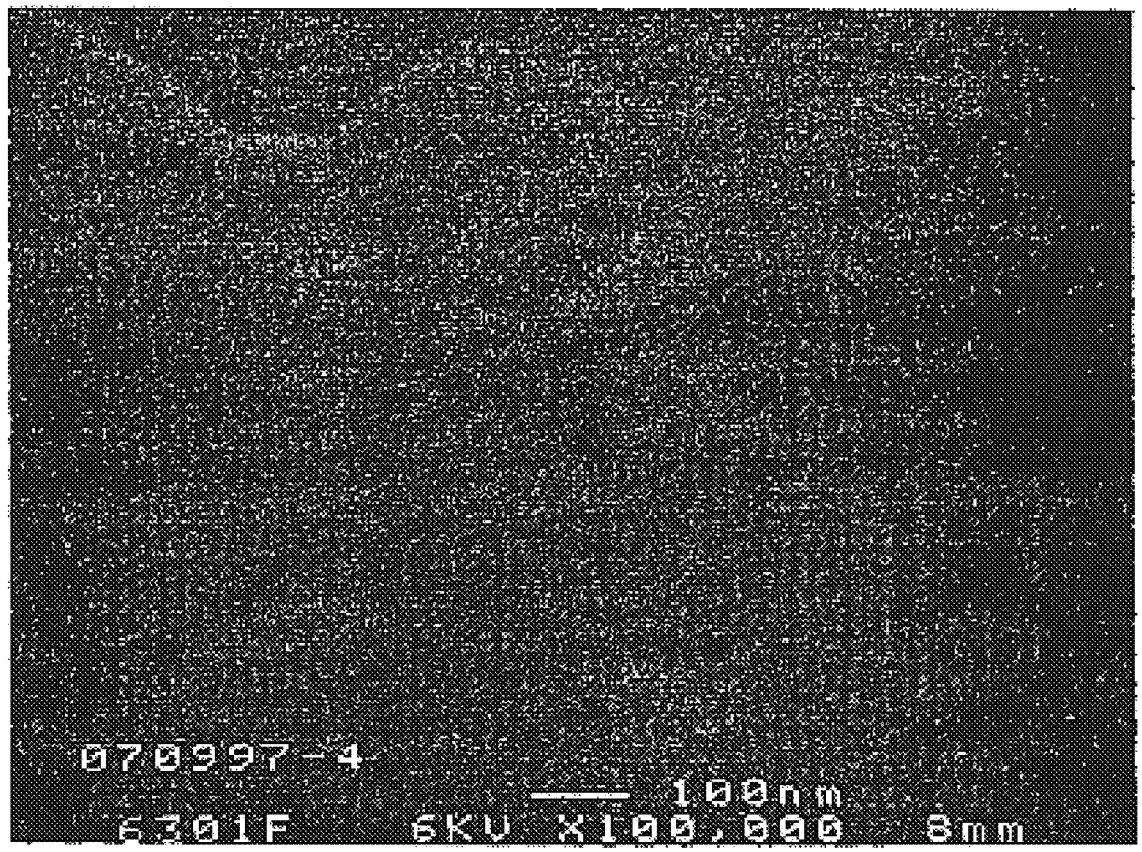
FIG. 3C is a scanning electron micrograph showing a relatively thick platinum layer deposited on silicon after annealing.

FIG. 3C is a scanning electron micrograph showing a relatively thick platinum layer having a thickness of about 1200 Å deposited on silicon. It was found that after annealing, the platinum did not form "islands" and was not easily removed upon exposure to a rinsing composition.

Figure 3D:
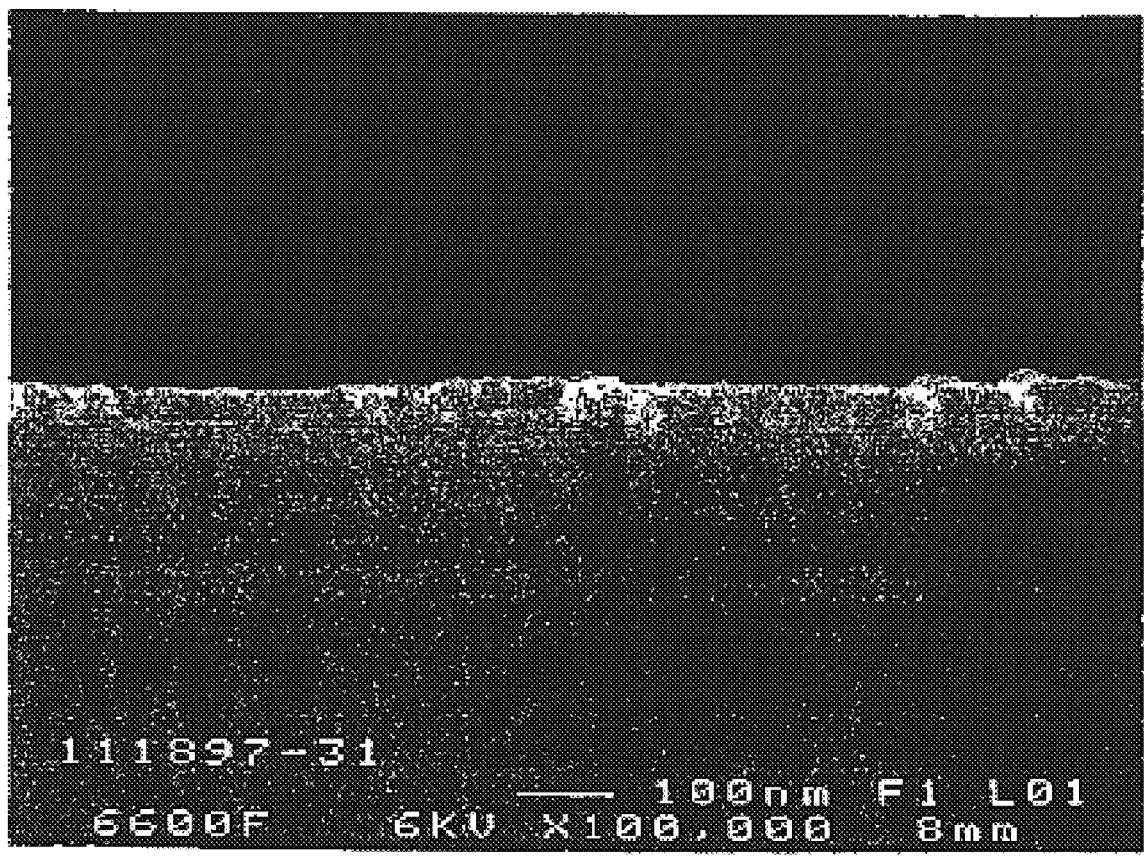
FIG. 3D is a scanning electron micrograph of a cross section showing platinum deposited on an adhesion layer on silicon according to the present invention.

FIG. 3D is a scanning electron micrograph of a cross section showing platinum deposited on an adhesion layer on silicon according to the present invention. The lower thicker layer shown in FIG. 3D is silicon. The lighter area in the midsection of FIG. 3D consists of two layers; an adhesion layer of titanium nitride on the silicon having a platinum layer formed thereon.

Figure 3E:
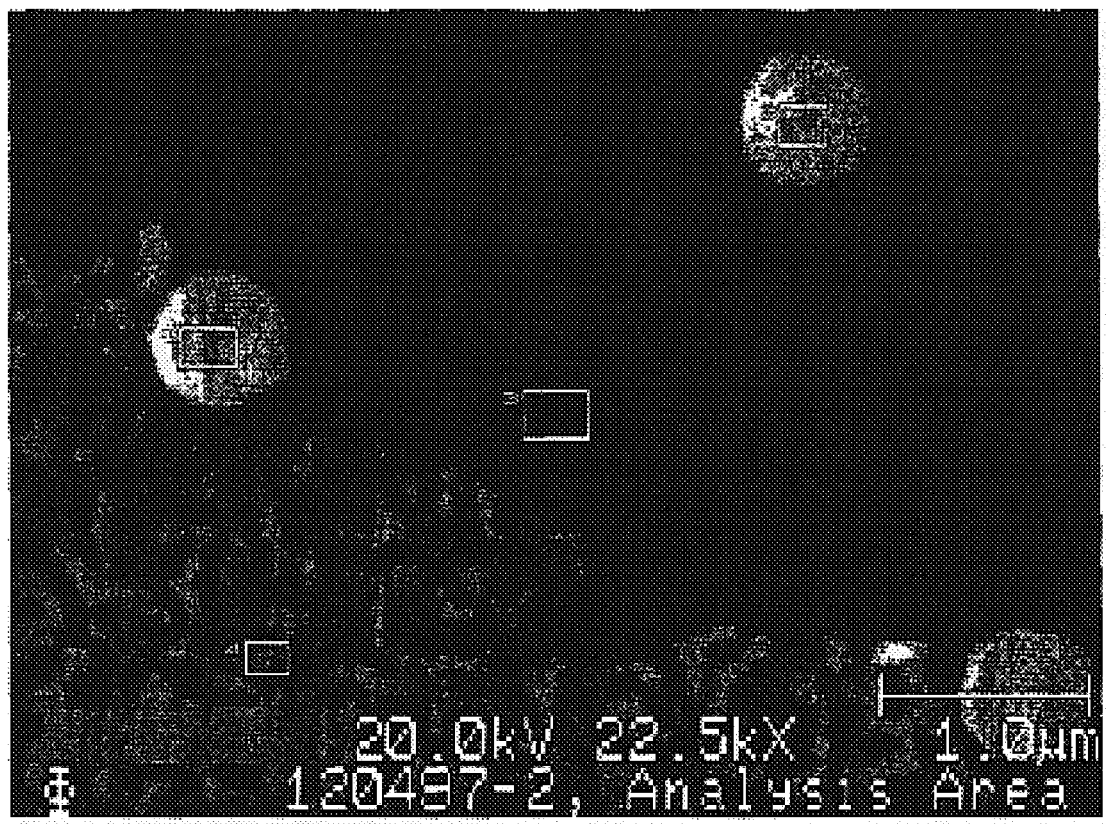
FIG. 3E is a scanning electron micrograph of a top view showing platinum deposited on an adhesion layer on silicon according to the present invention.

FIG. 3E is a scanning electron micrograph of a top view showing platinum deposited on an adhesion layer on silicon according to the present invention. In FIG. 3E, platinum was deposited over silicon and a patterned adhesion layer, in this case tungsten contacts, and was annealed. After partial rinsing, portions of the wafer (areas marked 1–4 in FIG. 3E) were analyzed per the manufacturer's instructions using Small Spot Auger Elemental Analysis, available from Physical Electronics, Eden Prairie, Minn. The elemental analysis confirmed that that platinum formed directly over the tungsten contacts. See areas marked 1 and 2 in FIG. 3E. The area marked as 3 shows the silicon having substantially no platinum remaining thereon after rinsing. The area marked as 4 shows pooled platinum (or platinum islands) on silicon prior to rinsing.

All patents and references cited herein are incorporated in their entirety as if each were incorporated separately. This invention has been described with reference to illustrative embodiments and is not meant to be construed in a limiting sense. As described previously, one skilled in the art will recognize that various other illustrative applications may utilize the patterned platinum layer as described herein. Various modifications of the illustrative embodiments, as well as additional embodiments of the invention, will be apparent to persons skilled in the art upon reference to this description. It is therefore contemplated that the appended claims will cover any such modifications or embodiments that may fall within the scope of the present invention as defined by the accompanying claims.

What is claimed is:

1. A method for patterning a platinum layer in the fabrication of integrated circuits, the method comprising:
   providing a substrate assembly including a surface;
   forming a patterned metal-containing adhesion layer on the surface, resulting in at least one exposed surface region of the substrate assembly;
   forming platinum on the patterned metal-containing adhesion layer and the at least one exposed surface region of the substrate assembly;
   annealing the substrate assembly including the patterned metal-containing adhesion layer and the platinum thereon, causing islands of non-adhered platinum to form on the at least one exposed surface region of the substrate assembly, while portions of the platinum on the patterned metal-containing adhesion layer adhere in a configuration substantially the same as that of the adhesion layer; and
   removing the islands of non-adhered platinum from the at least one exposed surface region of the substrate assembly resulting in a patterned platinum layer.

2. The method of claim 1, wherein forming the platinum comprises forming a platinum layer having a thickness of about 600 Å or less.

3. The method of claim 2, wherein forming the platinum comprises forming the platinum layer having a thickness of about 500 Å or less.

4. The method of claim 1, wherein annealing the substrate assembly comprises annealing the substrate assembly at a temperature less than the melting point of the at least one exposed surface region.

5. The method of claim 1, wherein annealing the substrate assembly comprises performing a rapid thermal anneal in an atmosphere of at 1 cast one of oxygen and nitrogen.

6. The method of claim 1, wherein the patterned metal-containing adhesion layer comprises at least one material selected from the group consisting of titanium, tantalum, tungsten, rhodium, iridium, cobalt, and nitrides, oxides, and silicides thereof.

7. The method of claim 1, wherein the patterned metal-containing adhesion layer comprises titanium nitride.

8. The method of claim 1, wherein the at least one exposed surface region comprises at least one material selected from the group consisting of silicon, silicon dioxide, BPSG, PSG, $Al_2O_3$, and combinations thereof.

9. A method for forming a discontinuous conductive layer in the fabrication of integrated circuits, the method comprising:
   providing a substrate assembly comprising a surface having at least one metal-containing adhesion region and at least one surface region;
   forming a platinum layer on the surface of the substrate assembly;
   annealing the substrate assembly including the platinum layer formed thereon, causing islands of non-adhered platinum to form on the at least one surface region of the substrate assembly, while portions of the platinum layer on the at least one metal-containing adhesion region are maintained in a configuration substantially the same as that of the adhesion region; and
   removing the islands of non-adhered platinum from the at least one surface region resulting in a discontinuous platinum layer.

10. The method of claim 9, wherein forming the platinum layer comprises forming the platinum layer having a thickness of about 600 Å or less.

11. The method of claim 10, wherein forming the platinum layer comprises forming the platinum layer having a thickness of about 500 Å or less.

12. The method of claim 9, wherein annealing the substrate assembly comprises annealing the substrate assembly at a temperature less than the melting point of the at least one surface region.

13. The method of claim 9, wherein annealing the substrate assembly comprises performing a rapid thermal anneal in an atmosphere of at least one of oxygen and nitrogen.

14. The method of claim 9, wherein the at least one metal-containing adhesion region comprises at least one material selected from the group consisting of titanium, tantalum, tungsten, rhodium, iridium, cobalt, and nitrides, oxides, and silicides thereof.

15. The method of claim 9, wherein the at least one metal-containing adhesion region comprises titanium nitride.

16. The method of claim 9, wherein the at least one surface region comprises at least one material selected from the group consisting of silicon, silicon dioxide, BPSG, PSG, $Al_2O_3$, and a combination thereof.

17. A method for forming a patterned platinum layer in the fabrication of integrated circuits, the method comprising:
   providing a substrate assembly including a surface having a patterned metal-containing adhesion portion thereon;

depositing a platinum layer on the surface of the substrate assembly and the patterned metal-containing adhesion portion, wherein the platinum layer has a thickness of about 600 Å or less;

annealing the substrate assembly at a temperature of about 1100° C. or less, causing the platinum layer to form unadhered pools on the surface of the substrate assembly, while portions of the platinum layer on the patterned metal-containing adhesion portion are maintained in a configuration substantially the same as that of the adhesion portion; and removing the unadhered pools of platinum from the surface of the substrate assembly such that a resulting patterned platinum layer has a configuration substantially that of the patterned metal-containing adhesion portion.

18. The method of claim 17, wherein the temperature is between about 650° C. and about 1100° C.

19. The method of claim 17, wherein annealing the substrate assembly occurs in an atmosphere comprising at least one compound selected from the group consisting of oxygen, ozone, nitrogen, argon, $NO_x$, $SO_3$, $N_2O$, and combinations thereof.

20. The method of claim 17, wherein annealing the substrate assembly comprises performing a rapid thermal anneal in an atmosphere of at least one of oxygen and nitrogen.

21. The method of claim 17, wherein the at least one patterned metal-containing adhesion portion comprises at least one material selected from the group consisting of titanium, tantalum, tungsten, rhodium, iridium, cobalt, and nitrides, oxides, and silicides thereof.

22. The method of claim 17, wherein the at least one patterned metal-containing adhesion portion comprises titanium nitride.

23. The method of claim 17, wherein the surface of the substrate assembly comprises at least one material selected from the group consisting of silicon, silicon dioxide, BPSG, PSG, $Al_2O_3$, and combinations thereof.

24. The method of claim 17, wherein removing the unadhered pools of platinum comprises rinsing the substrate assembly in a rinsing composition for a period of time of about 5 minutes or less.

25. The method of claim 24, wherein the rinsing composition comprises at least one composition selected from the group consisting of water, aqua regia, hydrofluoric acid, hydrochloric acid, hydrogen peroxide, and combinations thereof.

26. A method for use in forming a capacitor, the method comprising:

providing a substrate assembly, the substrate assembly including at least one surface; and forming an electrode on the at least one surface of the substrate assembly, wherein forming the electrode comprises at least forming a platinum electrode layer, wherein forming the platinum electrode layer comprises:

forming a discontinuous metal-containing adhesion layer on the at least one surface;

forming a platinum layer on at least portions of the at least one surface of the substrate assembly and the discontinuous metal-containing adhesion layer;

annealing the substrate assembly, causing islands of non-adhered platinum to form on portions of the at least one surface of the substrate assembly, while portions of the platinum layer on the discontinuous metal-containing adhesion layer adhere to the adhesion layer in a configuration substantially the same as that of the adhesion layer; and removing the islands of non-adhered platinum from the at least one surface of the substrate assembly.

27. The method of claim 26, wherein the substrate assembly includes an opening defined therein, wherein the opening is defined by a bottom surface of the substrate assembly and at least one side wall surface extending therefrom and further wherein the discontinuous metal-containing adhesion layer is formed on the surfaces defining the opening.

28. The method of claim 26, wherein the platinum layer has a thickness of about 600 Å or less.

29. The method of claim 28, wherein the platinum layer has a thickness of about 500 Å or less.

30. The method of claim 26, wherein annealing the substrate assembly comprises annealing the substrate assembly at a temperature between about 650° C. and about 1100° C.

31. The method of claim 26, wherein annealing the substrate assembly occurs in an atmosphere comprising at least one compound selected from the group consisting of oxygen, ozone, nitrogen, argon, $NO_x$, $SO_3$, $N_2O$, and combinations thereof.

32. The method of claim 26, wherein annealing the substrate assembly comprises performing a rapid thermal anneal in an atmosphere of at least one of oxygen and nitrogen.

33. The method of claim 26, wherein the discontinuous metal-containing adhesion layer comprises at least one material selected from the group consisting of titanium, tantalum, tungsten, rhodium, iridium, cobalt, and nitrides, oxides, and silicides thereof.

34. The method of claim 26, wherein the discontinuous metal-containing adhesion layer comprises titanium nitride.

35. The method of claim 26, wherein the at least one surface of the substrate assembly comprises at least one material selected from the group consisting of silicon, silicon dioxide, BPSG, PSG, $Al_2O_3$, and a combination thereof.

36. A method for forming a discontinuous conductive layer in the fabrication of integrated circuits, the method comprising:

providing a substrate assembly having a surface comprising at least one metal-containing adhesion region and at least one surface region;

forming a conductive metal layer on the surface of the substrate assembly, wherein the conductive metal layer comprises a metal different from a metal in the at least one metal-containing adhesion region;

annealing the substrate assembly including the conductive metal layer, causing islands of non-adhered conductive metal to form on the at least one surface region of the substrate assembly, while portions of the conductive metal layer on the at least one metal-containing adhesion region are maintained in a configuration substantially the same as that of the adhesion region; and removing the islands of non-adhered conductive metal from the at least one surface region resulting in a discontinuous conductive metal layer.

37. The method of claim 36, wherein forming the conductive metal layer comprises forming the conductive metal layer having a thickness of about 600 Å or less.

38. The method of claim 37, wherein forming the conductive metal layer comprises forming the conductive metal layer having a thickness of about 500 Å or less.

39. The method of claim 36, wherein annealing the substrate assembly comprises annealing the substrate assembly at a temperature less than the melting point of the at least one surface region.

40. The method of claim 36, wherein annealing the substrate assembly comprises performing a rapid thermal anneal in an atmosphere of at least one of oxygen and nitrogen.

41. The method of claim 36, wherein the at least one metal-containing adhesion region comprises at least one material selected from the group consisting of titanium, tantalum, tungsten, rhodium, iridium, cobalt, and nitrides, oxides, and silicides thereof.

42. The method of claim 36, wherein the at least one metal-containing adhesion region comprises titanium nitride.

43. The method of claim 36, wherein the at least one surface region comprises at least one material selected from the group consisting of silicon, silicon dioxide, BPSG, PSG, and $Al_2O_3$.

44. The method of claim 36, wherein the conductive metal layer comprises at least one metal selected from the group consisting of platinum or ruthenium.

45. A method for patterning a platinum layer in the fabrication of integrated circuits, the method comprising:
providing a substrate assembly including a surface;
forming a titanium nitride layer on the surface of the substrate assembly;
patterning the titanium nitride layer to form a patterned titanium nitride adhesion layer on the surface, wherein patterning the titanium nitride layer results in at least one exposed surface region of the substrate assembly;
depositing a material comprising platinum on the patterned titanium nitride adhesion layer and the at least one exposed surface region of the substrate assembly;
annealing the substrate assembly including the patterned titanium nitride adhesion layer and the material comprising platinum, causing islands of the material comprising platinum on the at least one exposed surface region of the substrate assembly, while portions of the material comprising platinum on the patterned titanium nitride adhesion layer are maintained in a configuration substantially the same as that of the adhesion layer; and
removing the islands of material comprising platinum from the at least one exposed surface region of the substrate assembly resulting in a patterned layer comprising platinum.

46. The method of claim 45, wherein depositing the material comprising platinum comprises depositing a platinum layer having a thickness of about 600 Å or less.

47. The method of claim 45, wherein depositing the material comprising platinum comprises depositing a platinum layer using a chemical vapor deposition process.

48. The method of claim 45, wherein depositing the material comprising platinum comprises depositing a platinum layer consisting essentially of platinum.

49. A method for forming a discontinuous conductive layer, the method comprising:
providing a substrate assembly having a surface comprising a metal-containing adhesion region and a surface region;
forming a conductive metal layer on the metal-containing adhesion region and the surface region of the substrate assembly;
annealing the substrate assembly including the conductive metal layer, whereby the conductive metal layer forms pools of conductive metal material on the surface region of the substrate assembly, while portions of the conductive metal layer on the metal-containing adhesion region are maintained in a configuration substantially the same as that of the adhesion region; and
removing the pools of conductive metal material from the surface region by rinsing the substrate assembly in a rinsing composition.

50. A method for patterning platinum in the fabrication of integrated circuits, the method comprising:
providing a substrate assembly including a surface;
forming a patterned metal-containing adhesion region on the surface, resulting in at least one exposed surface region of the substrate assembly;
forming platinum on the patterned metal-containing adhesion region and the at least one exposed surface region of the substrate assembly; and
annealing the substrate assembly, causing pooling of portions of the platinum on the at least one exposed surface region of the substrate assembly without pooling portions of the platinum on the patterned metal-containing adhesion region.

51. The method of claim 50, further comprising removing the pooled portions of the platinum from the at least one exposed surface region of the substrate assembly.

52. The method of claim 50, wherein forming the platinum comprises forming a platinum layer having a thickness of about 600 Å less.

* * * * *